United States Patent
Harvey et al.

(10) Patent No.: US 8,334,692 B2
(45) Date of Patent: Dec. 18, 2012

(54) SIMULTANEOUS MULTINUCLEAR MAGNETIC RESONANCE IMAGING

(75) Inventors: Paul Royston Harvey, Eindhoven (NL); Ingmar Graesslin, Boenningstedt (DE); Christoph Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 723 days.

(21) Appl. No.: 11/993,028

(22) PCT Filed: Jun. 21, 2006

(86) PCT No.: PCT/IB2006/052003
§ 371 (c)(1),
(2), (4) Date: Jun. 23, 2010

(87) PCT Pub. No.: WO2006/137026
PCT Pub. Date: Dec. 28, 2006

(65) Prior Publication Data
US 2010/0256477 A1 Oct. 7, 2010

(30) Foreign Application Priority Data
Jun. 24, 2005 (EP) .................................. 05105681

(51) Int. Cl.
*G01V 3/00* (2006.01)
(52) U.S. Cl. ........................................ 324/307; 324/309
(58) Field of Classification Search .......... 324/300–322; 600/407–445
See application file for complete search history.

(56) References Cited

U.S. PATENT DOCUMENTS

| 5,107,217 | A | 4/1992 | Duerr | |
|---|---|---|---|---|
| 5,446,384 | A | 8/1995 | Dumoulin | |
| 6,081,120 | A | 6/2000 | Shen | |
| 6,650,118 | B2 | 11/2003 | Leussler | |
| 6,727,697 | B2* | 4/2004 | Fiat | 324/307 |
| 7,633,293 | B2* | 12/2009 | Olson et al. | 324/318 |
| 7,701,213 | B2* | 4/2010 | Graesslin et al. | 324/318 |
| 2002/0011842 | A1 | 1/2002 | Fiat | |
| 2005/0017716 | A1 | 1/2005 | Fiat | |

FOREIGN PATENT DOCUMENTS

| EP | 0758751 A1 | 2/1997 |
|---|---|---|
| EP | 1314995 A2 | 5/2003 |

(Continued)

OTHER PUBLICATIONS

Boskamp, E.B., et al.; Whole Body LPSA Transceive Array with Optimized Transmit Homogeneity; 2002; Proc. Intl. Soc. Mag. Reson. Med.; 10:903.

(Continued)

*Primary Examiner* — Brij Shrivastav

(57) ABSTRACT

A magnetic resonance (MR) device for magnetic resonance imaging of a body placed in an examination volume includes a main magnet or generating a stationary and substantially homogeneous main magnetic field in the examination volume, and an RF coil arrangement for generating RF fields in the examination volume and/or for receiving MR signals from the body. In order to provide such an MR device, which is arranged to operate at the resonance (Larmor) frequencies of two or more different nuclear species at the same time, the RF coil arrangement includes independent resonator elements which are adjacently arranged in or near the examination volume. The adjacent resonator elements are alternately tuned to one of two or more different MR resonance frequencies, and each resonator element is associated with a separate signal transmission and/or signal reception channel of the MR device.

20 Claims, 1 Drawing Sheet

FOREIGN PATENT DOCUMENTS

| | | |
|---|---|---|
| WO | 9825163 A1 | 6/1998 |
| WO | 9837438 A1 | 8/1998 |

OTHER PUBLICATIONS

Gonen, O., et al.; Simultaneous and Interleaved Multinuclear Chemical-Shift Imaging, a Method for Concurrent, Localized Spectroscopy; 1994; J. of Magnetic Resonance; Series B; 104:26-33.

Lee, S. W., et al.; A Multinuclear Magnetic Resonance Imaging Technique—Simultaneous Proton and Sodium Imaging; 1986; Magnetic Resonance Imaging; 4:343-350.

Vaughan, J.T., et al.; Multiply Tuned, High Frequency Volume Coils for Clinical NMR; 1994; Proc. Soc. Mag. Reson.; vol. 3; p. 1119.

* cited by examiner

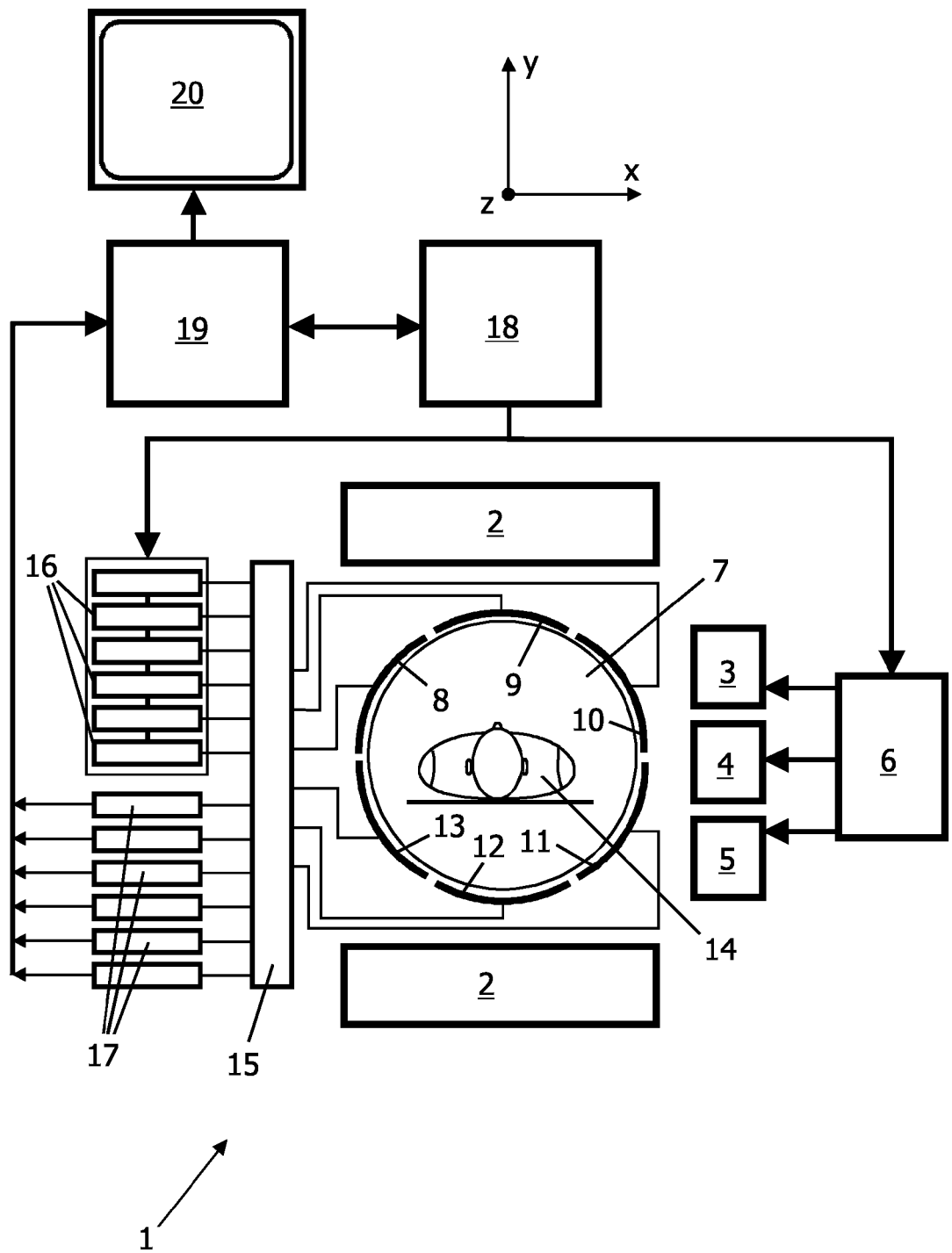

SIMULTANEOUS MULTINUCLEAR MAGNETIC RESONANCE IMAGING

The invention relates to an MR device for magnetic resonance imaging of a body placed in an examination volume.

Furthermore, the invention relates to a method for MR imaging and to a computer program for an MR device.

In magnetic resonance imaging (MRI) pulse sequences consisting of RF pulses and switched magnetic field gradients are applied to an object (a patient) placed in a homogeneous magnetic field within an examination volume of an MR device. In this way, phase encoded magnetic resonance signals are generated, which are scanned by means of RF receiving antennas in order to obtain information from the object and to reconstruct images thereof. Since its initial development, the number of clinically relevant fields of application of MRI has grown enormously. MRI can be applied to almost every part of the body, and it can be used to obtain information about a number of important functions of the human body. The pulse sequence, which is applied during an MRI scan, plays a significant role in the determination of the characteristics of the reconstructed image, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

So-called molecular imaging and diagnostics (MID) is rapidly developing during the last years. MID is sometimes defined as the exploitation of specific molecules for image contrast and for diagnosis. This definition refers to the in-vivo measurement and characterization of cellular and molecular level processes in human subjects and to the analysis of biomolecules to screen, diagnose and monitor the human health status and to assess potential risks. An important prerequisite for molecular imaging is the ability to image molecular targets and gene expression. At the moment MR imaging is considered to be one of the most promising modalities in molecular imaging. Therefore, MR imaging is expected to play an essential role in the clinical use of MID for screening, targeted drug delivery and therapy evaluation. Highly sensitive contrast agents have recently been used to allow MR imaging of molecular targets and gene expression. As mentioned above, MRI can visualize the anatomy with good spatial resolution, is applicable to all body regions and will allow reproducible and quantitative imaging. It can also be used for intravascular and needle image-guided drug delivery. MR can partly assess molecular information, for example through spectroscopy.

It is important to note that MID using MRI will rely on the accurate acquisition and registration of signals from different nuclear species. The ability to acquire such data simultaneously will be very beneficial—if not essential—in clinical practice. In addition, the signal data acquired from one species may be used to enhance or correct the data acquired from the other for the purposes of MID.

U.S. Pat. No. 6,081,120 discloses an RF coil arrangement for an MR apparatus that can be operated at different resonance frequencies in order to detect multiple nuclear species. The known coil arrangement utilizes a switchable multi-layer coil combined with a bank of matching and tuning capacitors. The user of the known apparatus can choose from different combinations of coil segments and matching and tuning capacitors by operating corresponding electronic switches. A change of the resonance frequency of the coil arrangement can be accomplished in this way.

One drawback of the known system with regard to the application in the connection with MID is that the RF coil arrangement can be tuned to only a single resonance frequency at a time. Thus no real simultaneous acquisition of MR signals at different resonance frequencies is possible. A further drawback is that the known system requires elaborate switching electronics. These electronics, which are directly connected to the RF coils of the known MR apparatus, may have an adverse effect on MR signal quality and also on overall system reliability.

Therefore, it is readily appreciated that there is a need for an improved device for magnetic resonance imaging which enables the simultaneous, i.e. parallel acquisition of MR images at different resonance frequencies for the purposes of MID. It is consequently the primary object of the present invention to provide an MR device which is arranged to operate at the resonance (Larmor) frequencies of two or more different nuclear species at the same time.

In accordance with the present invention, an MR device for magnetic resonance imaging of a body placed in an examination volume is disclosed, which comprises a main magnet for generating a stationary and substantially homogeneous main magnetic field in the examination volume, and an RF coil arrangement for generating RF fields in the examination volume and/or for receiving MR signals from the body. The RF coil arrangement comprises a plurality of independent resonator elements, which are adjacently arranged in or near the examination volume. The adjacent resonator elements are alternately tuned to one of at least two different MR resonance frequencies, and each resonator element is associated with a separate signal transmission and/or signal reception channel of the MR device.

The essential feature of the MR device of the invention is that a plurality of independently tuneable resonator elements are adjacently arranged, wherein the resonator elements are alternately tuned to the resonance frequencies of two or more different nuclei (as for example $^1$H and $^{19}$F). The different resonator elements are separately connected to corresponding transmitters and/or receivers. The advantage of the MR device according to the invention is thus that real simultaneous volume imaging and spectroscopy of the examined object is possible at the different resonance frequencies. No intricate switching electronics are required for this purpose.

A further advantage of the MR device of the invention is that it enables a single imaging sequence comprising RF pulses and switched magnetic field gradients to be used for multiple different nuclei at the same time. The same RF pulses are irradiated via the correspondingly tuned resonator elements at the different frequencies, and the switched gradients are used to acquire images and spectra of the corresponding nuclei in parallel. The simultaneous acquisition simplifies the registration of MR signal data. This is a serious problem with conventional systems, for example, when the patient moves between the signal acquisitions of different nuclear species. In particular in interventional MR, in which, for example, the position of an interventional instrument has to be determined from the reconstructed images, incorrect registration of acquired data is highly dangerous.

The simultaneous MR signal excitation and acquisition enabled by the device according to the invention has the further advantage that steady state imaging sequences (so-called SSFP or True FISP sequences) can be employed on each individual channel to increase the amplitude of the MR signals. Their use is possible with the device of the invention since—in contrast to the known techniques—no interleaving of different imaging sequences at different MR frequencies is necessary. In this way, problems of insufficient signal strength due to the different abundance of nuclear species can be effectively overcome.

Because a separate transmission channel is associated with each resonator element in accordance with the invention, the RF field distribution can be advantageously controlled completely at the respective frequencies in the examination volume. This is because any conceivable current distribution can be generated in the coil arrangement by selecting the amplitude and the phase on the individual transmission channels. For these purposes it is advantageous to distribute the resonator elements on a surface surrounding the examination volume. If the resonator elements are for example distributed on the surface of a cylinder, it is notably possible to imitate the field distribution of a conventional cylindrical birdcage coil at two different frequencies in parallel. An asymmetric cross section of the examination volume is also possible, for example in order to maximize the strength of the magnetic field gradients and thereby the image resolution at the location of the examined anatomy. The same principle can be applied to form head or surface coil arrays of the MR apparatus. The amplitude and the phase of each individual transmission channel can be controlled by the software of the MR device, thus enabling the direct interactive control of the RF field distribution (RF shimming).

Because of the possibility of selection of an arbitrary spatial distribution of the RF field in the examination volume by means of the RF coil arrangement in accordance with the invention, an individual spatial encoding can be impressed on the excited nuclear magnetization corresponding to the different nuclear species; this encoding can for example be used for fast volume imaging (so-called Transmit SENSE method).

It is further advantageous with the MR device of the invention that each resonator element of the RF coil arrangement is associated with a separate signal reception channel. Sub-images can be formed separately from the detected MR signals for each reception channel. These sub-images can be combined at a later stage so as to form an overall image. This may be advantageous on the one hand for improving the signal-to-noise ratio, the individual resonator elements then being used as synergy coils in parallel at the two different frequencies. It is on the other hand also possible to combine the individual images on the basis of the spatial sensitivity profiles assigned to the individual resonator elements, thus saving measurement time during imaging (so-called SENSE method).

In practical applications of the invention two or more independent resonator elements of the MR device according to the invention will be tuned to one resonance frequency, while two or more further resonator elements will be tuned to another resonance frequency. It is useful if resonator elements tuned to the same resonance frequency are electromagnetically decoupled from one another. The mutual decoupling of the resonator elements can be realized by means of capacitances and inductances (decoupling networks) arranged between the conductors of the respective resonator elements. The electromagnetic decoupling ensures that RF feeding via one transmission channel takes place only into the resonator element associated with this channel. Analogously, the MR signals received via one of the reception channels can be unambiguously attributed to the respective resonator element provided that a sufficient electromagnetic decoupling is present.

As stated above, the MR signal excitation and acquisition is performed with the MR device according to the invention by means of an MR imaging sequence comprising switched magnetic field gradients and RF pulses generated simultaneously at the two or more different MR resonance frequencies via the separate transmission channels. The MR signals are acquired from the examined body also simultaneously at the different frequencies via the separate signal reception channels. An MR image is then reconstructed from the acquired signal data, wherein a single image may be generated depicting the occurrence of different nuclear species corresponding to the different MR resonance frequencies. The parameters of the imaging sequence, i.e. most notably the waveforms of the switched magnetic field gradients, may be chosen at first as determined by the desired image resolution of the nuclear species with the lowest gyromagnetic ratio. For all nuclear species to be detected the individual RF excitation bandwidths and the signal sampling bandwidths (determining the field-of-view) are then adjusted in order to achieve the desired image resolution and image size using the afore determined gradient waveforms. In this way, a single gradient configuration and image acquisition can be utilized to acquire MR signals from the two or more nuclear species simultaneously.

It is particularly advantageous in accordance with the invention if each of the resonator elements of the MR apparatus is multiply tuned to two or more resonant frequencies. A technique as disclosed in the above-mentioned document U.S. Pat. No. 6,081,120 can be employed for this purpose. Up to four different nuclear species may for example be detected with a system of the invention comprising only two dual tuned independent resonator elements. Furthermore, multiple tuning of each of the resonator elements is advantageous because each resonator element can be selected more or less arbitrarily to operate at a different resonance frequency during different phases of the image acquisition process. For example in the case of the two nuclear species $^1$H and $^{19}$F to be detected simultaneously, a first group of resonator elements may be tuned to the resonance frequency of $^1$H during a first acquisition period while a second group of resonator elements is tuned to $^{19}$F. During a second acquisition period the tuning scheme is reversed. The first group of resonator elements is tuned to the $^{19}$F frequency while the second group is tuned to the $^1$H frequency. The MR signals acquired during these two phases of the imaging process can then be combined during image reconstruction in order to improve image uniformity.

The invention not only relates to a device but also to a method for magnetic resonance imaging of at least a portion of a body placed in an examination volume of an MR device, the method comprising the steps of exciting nuclear magnetization within the body by means of an MR imaging sequence comprising switched magnetic field gradients and RF pulses, wherein the RF pulses are generated simultaneously at two or more different MR resonance frequencies by means of an RF coil arrangement comprising a plurality of independently tuneable resonator elements; simultaneously acquiring MR signals from the body at the different MR resonance frequencies via separate signal reception channels associated with the resonator elements; reconstructing an MR image from the acquired MR signals.

It is known that different nuclear species have different (natural) abundances. Usually MR signals of lowly abundant nuclear species have to be acquired and accumulated repeatedly in order to obtain a sufficient signal to noise ratio. With the method of the invention it is therefore useful to multiply repeat the steps of exciting nuclear magnetization and acquiring MR signals. Different MR images corresponding to nuclear species with different abundance are then sensibly reconstructed at different repetition rates. For example the high natural abundance of $^1$H can advantageously be exploited to achieve a higher frame rate for the proton images than for the images corresponding to the less abundant nuclei. As an alternative, MR images for the differently abundant nuclear species may be acquired and reconstructed at different image resolutions to account for the low MR signal strength of the less abundant species.

A computer program adapted for carrying out the imaging procedure of the invention can advantageously be implemented on any common computer hardware, which is presently in clinical use for the control of magnetic resonance scanners. The computer program can be provided on suitable data carriers, such as CD-ROM or diskette. Alternatively, it can also be downloaded by a user from an Internet server.

The enclosed drawing discloses a preferred embodiment of the present invention. It should be understood, however, that the drawing is designed for the purpose of illustration only and not as a definition of the limits of the invention. The drawing shows an embodiment of a magnetic resonance scanner according to the invention.

In the drawing a magnetic resonance imaging device 1 in accordance with the present invention is shown as a block diagram. The apparatus 1 comprises a set of main magnetic coils 2 for generating a stationary and homogeneous main magnetic field, and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils 3, 4, 5 are energized via a power supply 6. The apparatus 1 further comprises an RF coil arrangement for generating RF fields in an examination volume 7. The RF coil arrangement comprises six independently tuneable resonator elements 8, 9, 10, 11, 12, 13 which are arranged adjacent to each other on a cylindrical surface around the examination volume 7. The resonator elements 8, 9, 10, 11, 12, 13 are used for emitting radio frequency (RF) pulses to a body 14. The resonator elements 8, 9, 10, 11, 12, 13 are alternately tuned to one of two different MR resonance frequencies. This means that elements 8, 10, 12 are tuned to the first MR frequency (for example the MR frequency of $^1H$ at the respective magnetic field strength $B_0$) while elements 9, 11, 13 are tuned to the second frequency (for example $^{19}F$). Each of the six resonator elements 8, 9, 10, 11, 12, 13 is connected to an RF switching module 15. Via the switching module 15 the relevant resonator element 8, 9, 10, 11, 12, 13 is connected to either a signal transmission channel 16 associated with the respective resonator element or with a signal reception channel 17, that is, in dependence of the mode of operation of the device (either transmit mode or receive mode). For each resonator element 8, 9, 10, 11, 12, 13 the MR device 1 has an individual transmission channel 16 (each including a power amplifier alternately operating at one of the two MR frequencies) and a signal reception channel 17 (each including a sensitive preamplifier, a demodulator and a digital sampling unit alternately operating at one of the two MR frequencies). The transmission channels 16 and the power supply 6 for the gradient coils 3, 4 and 5 are controlled by a control system 18 to generate the actual imaging sequence in accordance with the above-described invention. The control system is usually a microcomputer with a memory and a program control. For the practical implementation of the invention it comprises a programming with a description of an imaging procedure wherein RF pulses are generated simultaneously at the first frequency via the resonator elements 8, 10, 12 and at the second frequency via the resonator elements 9, 11, 13. The signal reception channels 17 are coupled to a data processing unit 19, for example a computer, for transformation of the received magnetic resonance signals into an image. This image can be made visible, for example, on a visual display unit 20.

The invention claimed is:

1. A magnetic resonance (MR) device for magnetic resonance imaging of a body placed in an examination volume, the MR device comprising:
    a main magnet for generating a stationary and substantially homogeneous main magnetic field in the examination volume; and
    an RF coil arrangement for generating RF fields in the examination volume and/or for receiving MR signals from the body, wherein
    the RF coil arrangement comprises at least four independent resonator elements which are adjacently arranged in or near the examination volume,
    adjacent resonator elements are alternately tuned to one of two or more different MR resonance frequencies, and
    each resonator element is associated with a separate signal transmission and/or signal reception channel of the MR device.

2. The MR device of claim 1, wherein the resonator elements are distributed on a surface surrounding the examination volume.

3. The MR device of claim 2, wherein the resonator elements are distributed on the surface of a cylinder.

4. The MR device of claim 1, wherein the resonator elements form a head or surface coil array.

5. The MR device of claim 1, wherein two or more independent resonator elements are tuned to the same MR resonance frequency.

6. The MR device of claim 5, wherein resonator elements tuned to the same MR resonance frequency are electromagnetically decoupled from one another.

7. The MR device of claim 1, wherein the MR device further comprises gradient coils for the generation of magnetic field gradients in the examination volume, the MR device being configured to:
    excite nuclear magnetization within the body by an MR imaging sequence comprising switched magnetic field gradients and RF pulses generated simultaneously at the two or more different MR resonance frequencies via the separate signal transmission channels,
    acquire MR signals from the body simultaneously at the two or more different MR resonance frequencies via the separate signal reception channels,
    reconstruct an MR image from the acquired MR signals.

8. The MR device according to claim 7, wherein the MR device is further configured to reconstruct a single MR image depicting occurrence of different nuclear species corresponding to the two or more different MR resonance frequencies in the body.

9. The MR device according to claim 8, wherein the MR device is further configured to:
    prescribe parameters of the sequence of switched magnetic field gradients as required in terms of image resolution for a nuclear species with a lower gyromagnetic ratio,
    adjust the parameters of the sequence of RF pulses and MR signal acquisition bandwidths for both the different nuclear species prescribed based on the parameters of the sequence of switched magnetic field gradients.

10. The MR device of claim 1, wherein each of the adjacent resonator elements is multiply tuned to the two or more different MR resonant frequencies.

11. The MR device of claim 1, wherein first and third resonator elements of the at least four independent resonator elements are tuned to a first MR resonance frequency of the two or more different MR resonance frequencies, and second and fourth resonator elements of the at least four independent resonator elements are tuned to a second MR resonance frequency of the two or more different MR resonance frequencies.

12. A method for magnetic resonance (MR) imaging of at least a portion of a body placed in an examination volume of an MR device, the method comprising the acts of:
exciting nuclear magnetization within the body an MR imaging sequence comprising switched magnetic field gradients and RF pulses, wherein the RF pulses are generated simultaneously at two or more different MR resonance frequencies by RF coil arrangement comprising at least four independently tunable resonator elements;
simultaneously acquiring MR signals from the body at the two or more different MR resonance frequencies via separate signal reception channels associated with the resonator elements; and
reconstructing an MR image from the acquired MR signals.

13. The method of claim 12, wherein the resonator elements are adjacently arranged in or near the examination volume and alternately tuned to one of the two or more different MR resonance frequencies.

14. The method of 12, wherein the method further comprises the following acts carried out prior to the acts of exciting nuclear magnetization and acquiring MR signals:
prescribing the parameters of the sequence of switched magnetic field gradients as required in terms of image resolution for a nuclear species corresponding to a lower MR resonance, frequency of the two or more different MR resonance frequencies; and
thereafter determining the parameters of the sequence of RF pulses and MR signal acquisition bandwidths for all nuclear species prescribed parameters of the sequence of switched magnetic field gradients.

15. The method of claim 12, wherein the acts of exciting nuclear magnetization and acquiring MR signals are multiply repeated, and wherein different MR images corresponding to nuclear species with different abundance are reconstructed at different repetition rates.

16. The method of claim 12, wherein first and third resonator elements of the at least four independently tunable resonator elements are tuned to a first MR resonance frequency of the two or more different MR resonance frequencies, and second and fourth resonator elements of the at least four independently tunable resonator elements are tuned to a second MR resonance frequency of the two or more different MR resonance frequencies.

17. A magnetic resonance (MR) device for magnetic resonance imaging of a body placed in an examination volume, the MR device comprising:
a main magnet for generating a stationary and substantially homogeneous main magnetic field in the examination volume; and
an RF coil arrangement for generating RF fields in the examination volume and/or for receiving MR signals from the body, wherein
the RF coil arrangement comprises a plurality of independent resonator elements which are adjacently arranged in or near the examination volume,
adjacent resonator elements are alternately tuned to one of two or more different MR resonance frequencies, and
each resonator element is associated with a separate signal transmission and/or signal reception channel of the MR device,
wherein the resonator elements are distributed on a surface surrounding the examination volume, and
wherein the examination volume has an asymmetric cross section.

18. A non-transitory computer readable medium embodying computer instructions which, when executed by a processor, configure the processor to perform the acts of:
generating an MR imaging sequence comprising switched magnetic field gradients and RF pulses, wherein the RF pulses are generated simultaneously at two or more different MR resonance frequencies using at least four independently tunable resonator elements;
processing MR signals acquired simultaneously at the two or more different MR resonance frequencies via separate signal reception channels associated with independently tuned resonator elements of an RF coil arrangement; and
reconstructing an MR image from the acquired MR signals.

19. A non-transitory computer readable medium embodying computer instructions which, when executed by a processor, configure the processor to perform the acts of:
generating an MR imaging sequence comprising switched magnetic field gradients and RF pulses, wherein the RF pulses are generated simultaneously at two or more different MR resonance frequencies;
processing MR signals acquired simultaneously at the two or more different MR resonance frequencies via separate signal reception channels associated with independently tuned resonator elements of an RF coil arrangement:
reconstructing an MR image from the acquired MR signals;
prescribing parameters of the sequence of switched magnetic field gradients as required in terms of image resolution for a nuclear species corresponding to lower MR resonance, frequency of the two or more different MR resonance frequencies; and
determining the parameters of the sequence of RF pulses and an MR signal acquisition bandwidths for all nuclear species based on the prescribed parameters of the sequence of switched magnetic field gradients.

20. A method for magnetic resonance (MR) imaging of at least a portion of a body placed in an examination volume of an MR device, the method comprising the acts of:
exciting nuclear magnetization within the body by an MR imaging sequence comprising switched magnetic field gradients and RF pulses, wherein the RF pulses are generated simultaneously at two or more different MR resonance frequencies by an RF coil arrangement comprising a plurality of independently tunable resonator elements;
simultaneously acquiring MR signals from the body at the two or more different MR resonance frequencies via separate signal reception channels associated with the resonator elements;
reconstructing an MR image from the acquired MR signals;
prescribing parameters of the sequence of switched magnetic field gradients as required in terms of image resolution for a nuclear species corresponding to lower MR resonance frequency of the two or more different MR resonance frequencies; and
determining the parameters of the sequence of RF pulses and an MR signal acquisition bandwidths for all nuclear species based on the prescribed parameters of the sequence of switched magnetic field gradients.

* * * * *